United States Patent
Han et al.

(10) Patent No.: US 7,764,149 B2
(45) Date of Patent: Jul. 27, 2010

(54) ELECTROMAGNETIC BANDGAP STRUCTURE AND PRINTED CIRCUIT BOARD

(75) Inventors: Mi-Ja Han, Suwon-si (KR); Han Kim, Yongin-si (KR); Dae-Hyun Park, Ulsan (KR); Hyo-Jic Jung, Daejeon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 212 days.

(21) Appl. No.: 12/007,122

(22) Filed: Jan. 7, 2008

(65) Prior Publication Data

US 2008/0266018 A1 Oct. 30, 2008

(30) Foreign Application Priority Data

Apr. 30, 2007 (KR) ...................... 10-2007-0041991

(51) Int. Cl.
 *H01P 1/203* (2006.01)
 *H01P 5/08* (2006.01)
(52) U.S. Cl. ...................... 333/204; 333/246
(58) Field of Classification Search ................ 333/167, 333/168, 185, 202–204, 206, 212
 See application file for complete search history.

(56) References Cited

U.S. PATENT DOCUMENTS 6,476,771 B1 * 11/2002 McKinzie, III .............. 343/756

FOREIGN PATENT DOCUMENTS

| JP | 2003-133801 | 5/2003 |
| JP | 2006-93482 | 4/2006 |
| WO | WO 2006/016586 | 2/2006 |

OTHER PUBLICATIONS

Korean Patent Office Action, mailed Mar. 18, 2008 and issued in corresponding Korean Patent Application No. 10-2007-0041991.
Japanese Office Action dated Apr. 27, 2010 and issued in corresponding Japanese Patent Application 2008-043021.

* cited by examiner

*Primary Examiner*—Benny Lee
*Assistant Examiner*—Gerald Stevens

(57) ABSTRACT

An electromagnetic bandgap structure and a printed circuit board that can solve a mixed signal problem between an analog circuit and a digital circuit are disclosed. In accordance with an embodiment of the present invention, the electromagnetic bandgap structure can include a metal layer; and a plurality of mushroom type structures including a metal plate and a via. Here, the plurality of mushroom type structures can be formed on the metal layer in a stacked structure. With the present invention, the small sized electromagnetic bandgap structure can have a lower bandgap frequency.

11 Claims, 8 Drawing Sheets

ELECTROMAGNETIC BANDGAP STRUCTURE AND PRINTED CIRCUIT BOARD

CROSS-REFERENCE TO RELATED PATENT APPLICATIONS

This application claims the benefit of Korean Patent Application No. 10-2007-0041991, filed on Apr. 30, 2007, in the Korean Intellectual Property Office, the disclosure of which is incorporated herein in its entirety by reference.

BACKGROUND OF THE INVENTION

1. Field of the Invention

The present invention relates to a printed circuit board, more specifically to a printed circuit board that can solve a mixed signal problem between an analog circuit and a digital circuit.

2. Background Art

Various apparatuses such as mobile communication terminals, personal digital assistants (PDA), laptop computers and digital multimedia broadcasting (DMB) devices have been launched in order to meet today's trend that mobility is considered as one of the most important issues.

Such apparatuses include a printed circuit board, which is configured to compound analog circuits (e.g. radio frequency (RF) circuits) and digital circuits for wireless communication.

FIG. 1 is a sectional view showing a printed circuit board including an analog circuit and a digital circuit. Although a 4-layered printed circuit board is illustrated, various printed circuit boards such as 2 and 6-layered printed circuit boards can be applied. Here, the analog circuit is assumed to be an RF circuit.

The printed circuit board 100 includes metal layers 110-1, 110-2, 110-3 and 110-4 (hereinafter, collectively referred to as 110), dielectric layers 120-1, 120-2 and 120-3 (hereinafter, collectively referred to as 120) stacked in between the metal layers 110, a digital circuit 130 mounted on the top metal layer 110-1 and an RF circuit 140.

If it is assumed that the metal layer 110-2 is a ground layer and the metal layer 110-3 is a power layer, a current passes through a via 160 connected between the ground layer 110-2 and the power layer 110-3 and the printed circuit board 100 performs a predetermined operation or function.

Here, an operation frequency of the digital circuit 130 and an electromagnetic (EM) wave 150 by harmonics components are transferred to the RF circuit 140, to thereby generate a problem mixed signals. The mixed signal problem is generated due to the EM wave, having a frequency within the frequency band in which the RF circuit 140 is operated, in the digital circuit 130. This problem results in obstructing the accurate operation of the RF circuit 140. For example, when the RF circuit 140 receives a signal ranging a certain frequency band, transferring the EM wave 150 including the signals ranging the certain frequency band from the digital circuit 130 may make it difficult to accurately receive the signal ranging the certain frequency band.

Solving the mixed signal problem becomes more difficult due to the increased complexity of electronic apparatuses and the higher operation frequency of the digital circuit 130.

The decoupling capacitor method, which is a typical solution for power noise, is not adequate for high frequencies. Accordingly, it is necessary to intercept or decrease the noise of the high frequencies between the RF circuit 140 and the digital circuit 130.

FIG. 2 is a sectional view showing an electromagnetic bandgap structure that solves a problem mixed signals between an analog circuit and a digital circuit in accordance with a conventional art, and FIG. 3 is a plan view showing a metal plate configuration of the electromagnetic bandgap structure shown in FIG. 2. FIG. 4 is a perspective view showing the electromagnetic bandgap structure shown in FIG. 2, and FIG. 5 is a schematic view showing an equivalent circuit of the electromagnetic bandgap structure shown in FIG. 2.

The electromagnetic bandgap structure 200 includes a first metal layer 210-1, a second metal layer 210-2, a first dielectric layer 220a a second dielectric layer 220b, a meal plate 232 and a via 234.

The first metal layer 210-1 and the metal plate 232 are connected to each other through the via 234. A mushroom type structure 230 is formed to include the metal plate 232 and the via 234 (refer to FIG. 4).

If the first meal layer 210-1 is a ground layer, the second metal layer 210-2 is a power layer. Also, if the first metal 210-1 is the power layer, the second layer 210-2 is the ground layer.

In other words, the repeated formation of the mushroom type structure 230 (refer to FIG. 3) results in a bandgap structure preventing a signal having a certain frequency band from being penetrated. At this time, the mushroom type structures 230, including the metal plates 232 and the vias 234, are repeatedly formed between the ground layer and the power layer.

The function preventing a signal having a certain frequency band from being penetrated, which is based on resistance $R_E$ and $R_P$, inductance $L_E$ and $L_P$, capacitance $C_E$, $C_P$ and $C_G$ and conductance $G_P$ and $G_E$, is approximated to the equivalent circuit shown in FIG. 5.

A mobile communication terminal is a good example for an electronic apparatus employing the board realized with the digital circuit and the RF circuit together. In the case of the mobile communication terminal, solving the problem mixed signals needs the noise shielding of an operation frequency band of the RF circuit between 0.8 and 2.0 GHz. The small sized mushroom type structure is also required. However, the foregoing electromagnetic bandgap structure may not satisfy the two conditions needed to solve the problem mixed signals.

Since the smaller sized mushroom type structure causes the bandgap frequency band shielding the noise to be increased, the mobile communication terminal is not effectively operated in the operation frequency band of the RF circuit between 0.8 and 2.0 GHz.

SUMMARY OF THE INVENTION

Accordingly, the present invention provides an electromagnetic bandgap structure and a printed circuit board that can allow the size not to be increased and have a low bandgap frequency band.

The present invention also provides an electromagnetic bandgap structure and a printed circuit board that can solve a problem mixed signal in an electronic apparatus (e.g. a mobile communication terminal) employing the board having the digital circuit and the RF circuit, realized therein together.

In addition, the present invention provides an electromagnetic bandgap structure and a printed circuit board that can allow the noise having a certain frequency band not to penetrate it.

An aspect of present invention features an electromagnetic bandgap structure including a first metal layer; a first dielectric layer, stacked on the first metal layer; a first metal plate, stacked on the first dielectric layer; a first via, connecting the first metal layer to the first metal plate; a second dielectric layer, stacked on the first metal plate and the first dielectric layer; a second metal layer, stacked on the second dielectric layer and having a hole formed at a predetermined position; a third dielectric layer, stacked on the second metal layer; a second metal plate, stacked on the third dielectric layer; and a second via, penetrating the hole formed in the second metal layer and connecting the first metal plate and the second metal plate.

Here, the second via can be formed to have an identical center axis to the first via, and the second via can be formed to have an identical center axis to the hole. At this time, a diameter of the hole can be set to be larger than that of the second via.

There can be a plurality of two-layered mushroom type structures including the first metal plates, the first vias, the second metal plates and the second vias. Here, a plurality of holes can be formed in the second metal layer, according to a position of each second via of the two-layered mushroom type structures The plurality of holes can be formed to be away from each other at regular intervals.

Another aspect of present invention features an electromagnetic bandgap structure including a metal layer; and a plurality of mushroom type structures including metal plates and vias. Here, the plurality of mushroom type structures can be formed on the metal layer in a stacked structure Here, each metal plate of any two adjacent ones of the plurality of mushroom type structures can be formed between metal layers.

Another aspect of present invention features an printed circuit board having an analog circuit and a digital circuit. The printed circuit board can include an electromagnetic bandgap structure which is disposed between the analog circuit and the digital circuit, the electromagnetic bandgap structure including a first metal layer; a first dielectric layer, stacked on the first metal layer; a first metal plate, stacked on the first dielectric layer; a first via, connecting the first metal layer to the first metal plate; a second dielectric layer, stacked on the first metal plate and the first dielectric layer; a second metal layer, stacked on the second dielectric layer and having a hole formed at a predetermined position; a third dielectric layer, stacked on the second metal layer; a second metal plate, stacked on the third dielectric layer; and a second via, penetrating the hole formed in the second metal layer and connecting the first metal plate and the second metal plate.

Here, the first metal layer can be any one of a ground layer and a power layer, and the second metal layer can be the other.

The second via can be formed to have an identical center axis to the first via, and the second via can be formed to have an identical center axis to the hole. At this time, a diameter of the hole can be set to be larger than that of the second via.

There can be a plurality of two-layered mushroom type structures including the first metal plates, the first vias, the second metal plates and the second vias. Here, a plurality of holes can be formed in the second metal layer, according to a position of each second via of the two-layered mushroom type structures.

The plurality of holes can be formed to be away from each other at regular intervals.

The analog circuit can be an RF circuit receiving a wireless signal from an outside.

Another aspect of present invention features a printed circuit board having an analog circuit and a digital circuit. The printed circuit board can include an electromagnetic bandgap structure which is disposed between the analog circuit and the digital circuit, the electromagnetic bandgap structure including a metal layer; and a plurality of mushroom type structures including metal plates and vias. Here, the plurality of mushroom type structures can be formed on the metal layer in a stacked structure.

Here, each metal plate of any two adjacent ones of the plurality of mushroom type structures can be formed between metal layers.

BRIEF DESCRIPTION OF THE DRAWINGS

These and other features, aspects and advantages of the present invention will become better understood with regard to the following description, appended Claims and accompanying drawings where:

DESCRIPTION OF THE EMBODIMENTS

Figure 1:
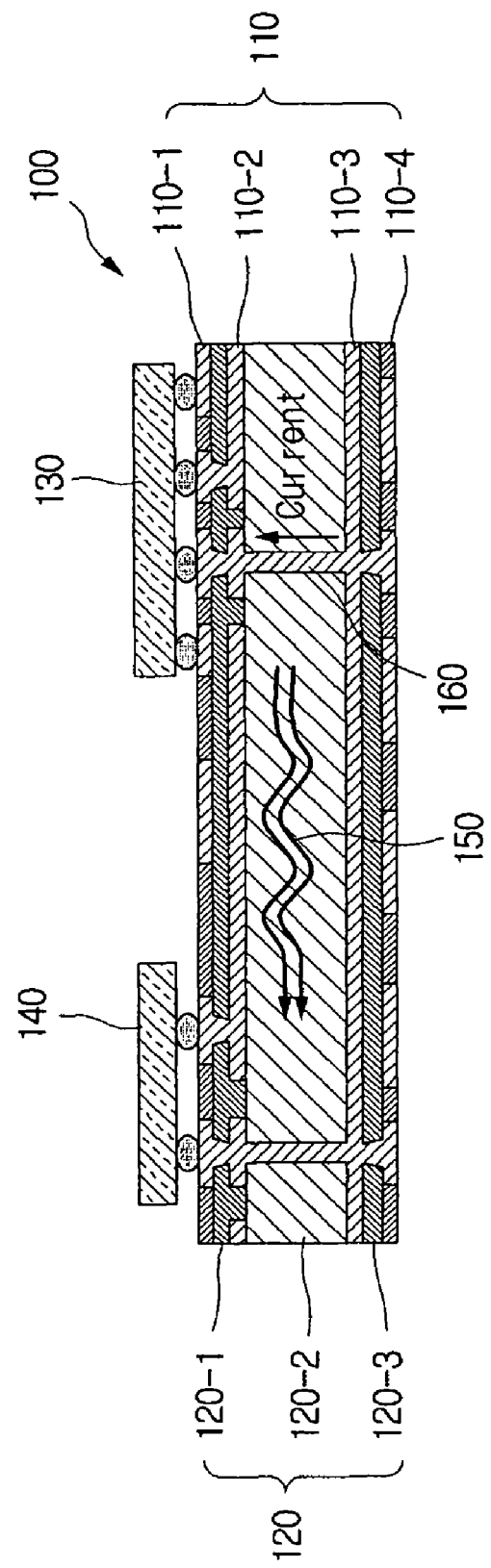
FIG. 1 is a sectional view showing a printed circuit board including analog circuit and a digital circuit.
Figure 2:
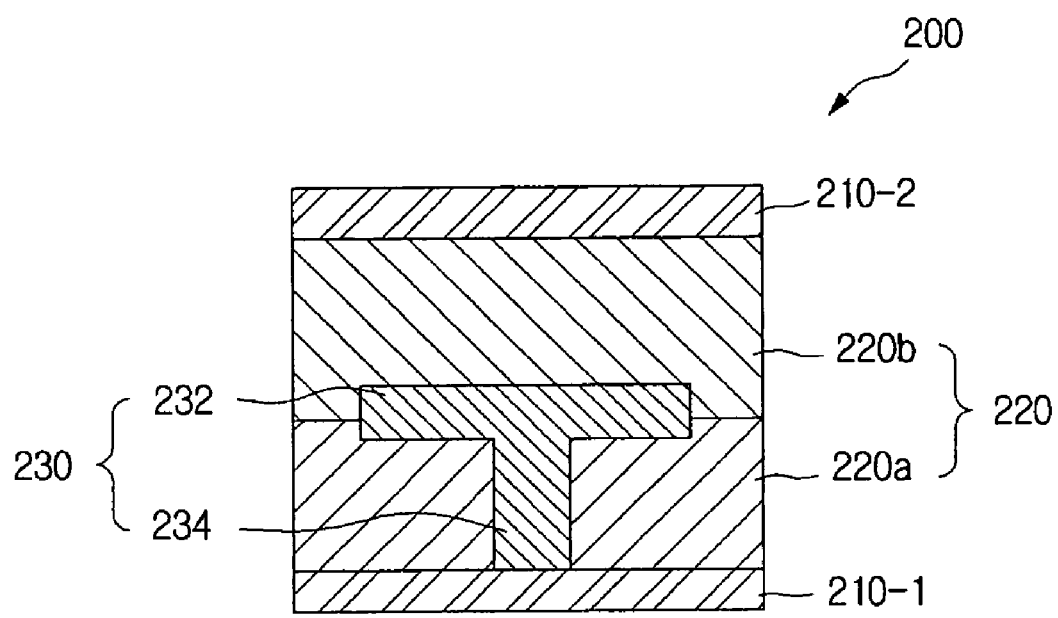
FIG. 2 is a sectional view showing an electromagnetic bandgap structure that solves a problem mixed signals between an analog circuit and a digital circuit in accordance with a conventional art.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other. For instance, the first element can be named the second element, and vice versa, without departing the scope of claims of the present invention. The term "and/or" shall include the combination of a plurality of listed items or any of the plurality of listed items.

When one element is described as being "connected" or "accessed" to another element, it shall be construed as being connected or accessed to the other element directly but also as possibly having another element in between. On the other hand, if one element is described as being "directly connected" or "directly accessed" to another element, it shall be construed that there is no other element in between.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Unless otherwise defined, all terms, including technical terms and scientific terms, used herein have the same meaning as how they are generally understood by those of ordinary skill in the art to which the invention pertains. Any term that is defined in a general dictionary shall be construed to have the same meaning in the context of the relevant art, and, unless otherwise defined explicitly, shall not be interpreted to have an idealistic or excessively formalistic meaning.

Hereinafter, some embodiments of the present invention will be described in detail with reference to the accompanying drawings.

Figure 6:
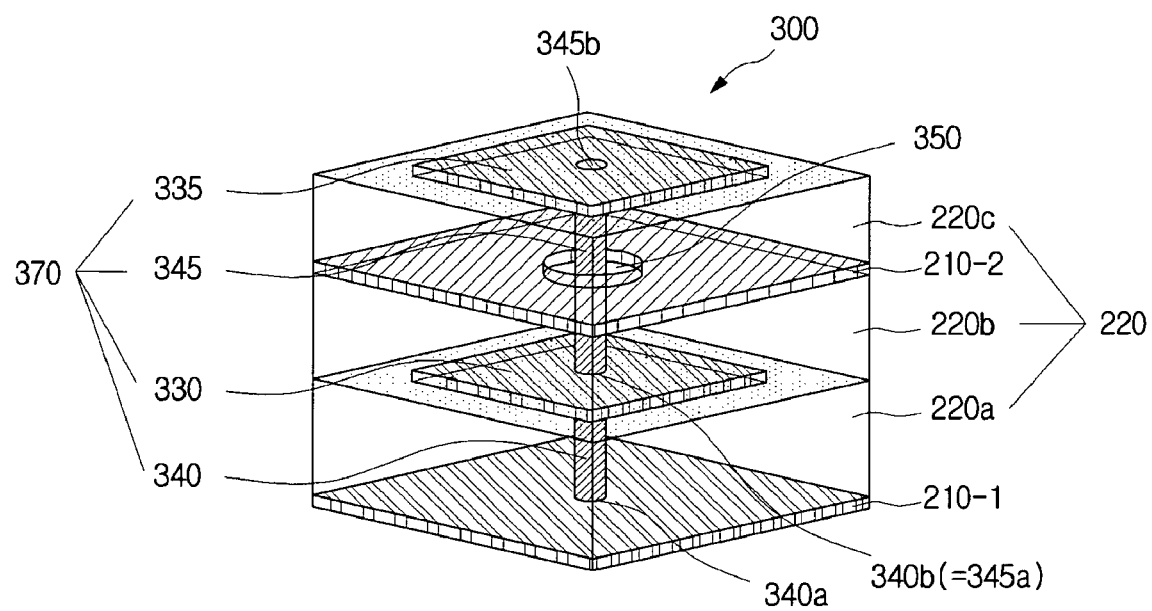
FIG. 6 is a perspective view showing an electromagnetic bandgap structure which solves a mixed signal problem between an analog circuit and a digital circuit.
Figure 7:
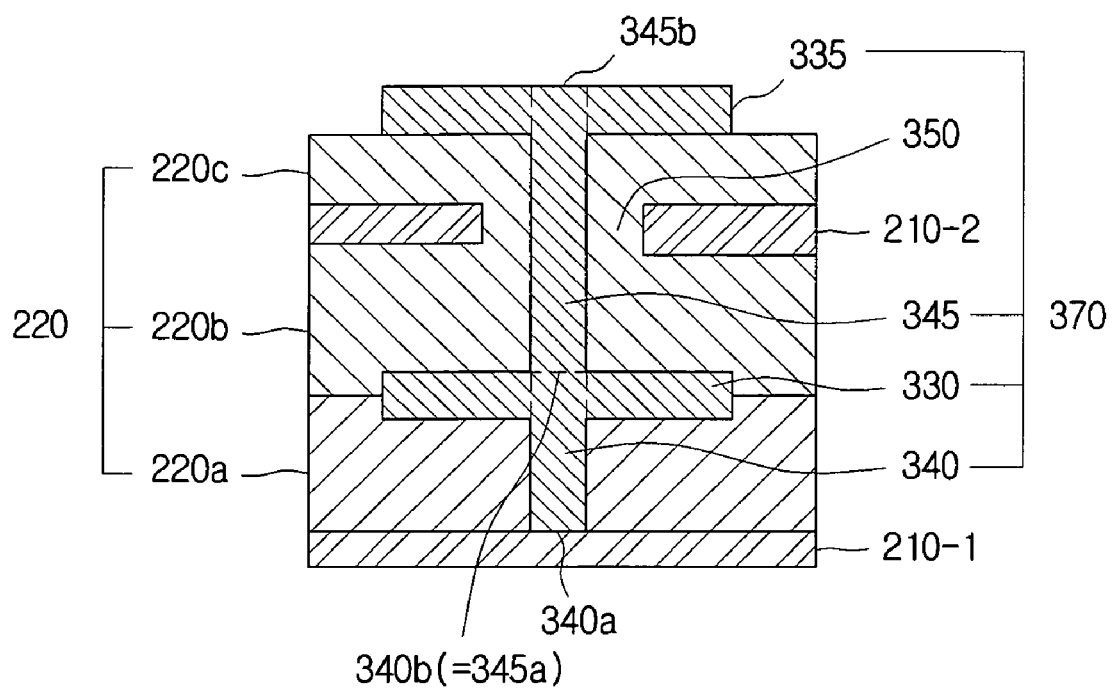
FIG. 7 is a sectional view showing an electromagnetic bandgap structure shown in FIG. 6.

FIG. 6 is a perspective view showing an electromagnetic bandgap structure which solves a mixed signal problem between an analog circuit and a digital circuit, and FIG. 7 is a sectional view showing an electromagnetic bandgap structure shown in FIG. 6.

Referring to FIG. 6 and FIG. 7, the electromagnetic bandgap structure 300 in accordance with an embodiment of the present invention can include a first metal layer 210-1, a second metal layer 210-2, having a hole 350 formed at a predetermined position, a first dielectric layer 220a, a second dielectric layer 220b, a third dielectric layer 220c, a first metal plate 330, a second metal plate 335, a first via 340 and a second via 345.

In other words, the first dielectric layer 220a can be stacked on the first metal layer 210-1, and the first metal plate 330 can be stacked on the first dielectric layer 220a. The first metal layer 210-1 and the first metal plate 330 can be connected to each other through the first via 340. The second dielectric layer 220b can be stacked on the first metal plate 330 and the first dielectric layer 220a, and the second metal layer 210-2 can be stacked in the second dielectric layer 220b. The third dielectric layer 220c can be stacked in the second metal layer 210-2, and the second metal plate 335 can be stacked in the third dielectric layer 220c. The first metal plate 330 and the second metal layer 335 can be connected to each other through the second via 345 penetrating the hole 350 formed in the second metal layer 210-2. Here, the first metal plate 330, the first via 340, the second metal plate 335 and the second via 345 can be arranged in the type in which the mushroom type structures are stacked as a two-layered structure (hereinafter, referred to as a "stacked mushroom type structure 370") by using the first metal layer 210-1 as a base surface.

As described with reference to FIG. 6 and FIG. 7, the below description is based on the type in which the mushroom type structures are stacked as the two-layered structure (i.e. the two-layered mushroom type structure). However, the electromagnetic bandgap structure 300 of the present invention is not limited to the two-layered mushroom type structure. Alternatively, the electromagnetic bandgap structure 300 can have the type in which the mushroom type structures are stacked in 3 or 4 or more-layered structure.

In other words, the electromagnetic bandgap structure 300 of the present invention can include a plurality of mushroom type structures having metal plates and vias. Here, the plurality of mushroom type structures can be formed on any one metal layer in the stacked structure. At this time, each metal plate of any two adjacent ones of the plurality of mushroom type structures can be formed between metal layers.

Each element of the electromagnetic bandgap structure 300 of the present invention will be described hereinafter.

The first metal layer 210-1 and the second metal layer 210-2 can be used as means for connecting an electrical power. For example, if the first metal layer 210-1 is a ground layer, the second metal layer 210-2 can be a power layer. If the first metal layer 210-1 is the power layer, the second metal layer 210-2 can be the ground layer. In other words, the first metal layer 210-1 and the second metal layer 210-2 can be each one of the ground layer and the power layer, which are placed close to each other, and a dielectric layer 220 can be placed between the ground layer and the power layer.

Accordingly, it is natural that any metal material capable of being provided with the power and transferring an electrical signal can be used without any limitation. The same can be applied to the first metal plate 330, the second metal plate 335, the first via 340 and the second via 345, which are described below.

The dielectric layer 220 can be formed between the first metal layer 210-1 and the second metal layer 210-2 and in an upper part of the second metal layer 210-2. The dielectric layer 220 can be distinguished into the first dielectric layer 220a, the second dielectric layer 220b and the third dielectric layer 220c according to their formation time.

Here, the first dielectric layer 220a, the second dielectric layer 220b and the third dielectric layer 220c, respectively, can consist of materials having different dielectric constants, but alternatively, at least one dielectric layer can consist of materials having the same dielectric constant. For example, the second dielectric layer 220b and the third dielectric layer 220c can be formed by using the same dielectric material for the convenience of the stacking process and the adjustment of the bandgap frequency.

As such, selecting or adjusting the dielectric material (i.e. the corresponding dielectric constant) included in each dielectric layer adequately can make it possible to approach a desired bandgap frequency band (i.e. between 0.8 and 2.0 GHz) in accordance with the present invention. Of course, each stacked thickness of the three dielectric layers 220a, 220b and 220c can also be adequately adjusted to approach the desired bandgap frequency band.

For example, even though the electromagnetic bandgap structures 300 have the same size, the corresponding bandgap frequency band can approach the desired frequency band by largely decreasing the stacked thickness of the second dielectric layer 220b or the third dielectric layer 220c and increasing the stacked thickness of the first dielectric layer 220a as much as the stacked thickness of the second dielectric layer 220b or the third dielectric layer 220c is decreased. Here, the bandgap frequency can refer to the frequency prevented from being transferred among the electromagnetic wave transferred from one side to the other side.

The first via 340 can connect the first metal layer 210-1 to the first metal plate 330. Also, the second via 345 can connect the first metal plate 330 to the second metal plate 335. At this time, as shown in FIG. 6 and FIG. 7, the second via 345 can be formed to have the same center axis as the first via 340. Of course, the second via 345 can be formed to have a different center axis from the first via 340. For describing the method of forming these vias, the method of forming the first via 340, for example, will be described below.

The first metal layer 210-1, the first dielectric layer 220a and the first metal plate 330 can be successively stacked. A via land (not shown) can be formed at a position in the metal plate 330. Here, the position of the metal plate 330 can be the position in which the first via 340 is desired to be formed for the electrical connection to the first metal layer 210-1. The via land, which is to reduce the position error in the drilling process for forming the first via 340, can be formed more largely than the sectional area size of the first via 340. Then, through the drilling process, the via can be formed to penetrate the via land and the first dielectric layer 220a. Alternatively, the via penetrating the via land, the first dielectric layer 220a and the first metal layer 210-1 can be formed. After the via is formed, the plating process can be performed to allow a plating layer to be formed on the internal wall of the via in order to electrically connect the first metal layer 210-1 to the first metal plate 330. According to the plating process, a plating layer can be formed on the internal wall of the via excluding the center part among the inside part of the via or the entire inside part of the via can be completely filled. In case that the inside part of the via has an empty center part, the empty center part can be filled with the dielectric material or air. Through the foregoing processes, the first via 340 can have one end part 340a, connected to the first metal layer 210-1, and the other end part 340b, connected to the first metal plate 330.

The second via 345 can be formed through the similar processes to the aforementioned processes of forming the first via 340. Through the processes, the second via 345 can have one end part 345a, which is connected to the first metal plate 330, and the other end part 345b, which is connected to the second metal plate 335. Of course, the process of forming the hole 350 can be performed by removing a predetermined part of the second metal layer 210-2 before forming the second via 345 connecting the first metal plate 330 to the second metal plate 335. For example, the hole 350 can be formed at a position of the second metal layer 210-2, and then, the second via 345 penetrating the hole 350 can be formed. At this time, the process of forming the hole 350 can be performed after the third dielectric layer 220c is stacked in the second metal layer 210-2 or before the third dielectric layer 220c is stacked in.

Here, the second via 345 can be formed to have the same center axis as the hole 350 in order to connect the metal plates to each other by penetrating the hole 350 formed on the second metal layer 210-2. Similarly, the hole 350 formed on the second metal layer 210-2 can have a larger diameter than the second via 345 in order to allow the second via 345 to penetrate the hole 350 formed on the second metal layer 210-2 and to connect the metal plates to each other.

Although FIG. 6 and FIG. 7 illustrate the case that one first via 340 and one second via 345 are connected to each metal plate, a plurality of vias can be connected to each metal plate. Also, even if the first metal plate 330 and the second metal plate 335 have a regular square shape, the first and second metal plates 330 and 335 can have various shapes such as polygons, for example, triangles and hexagons, circles and ellipses.

Figure 3:
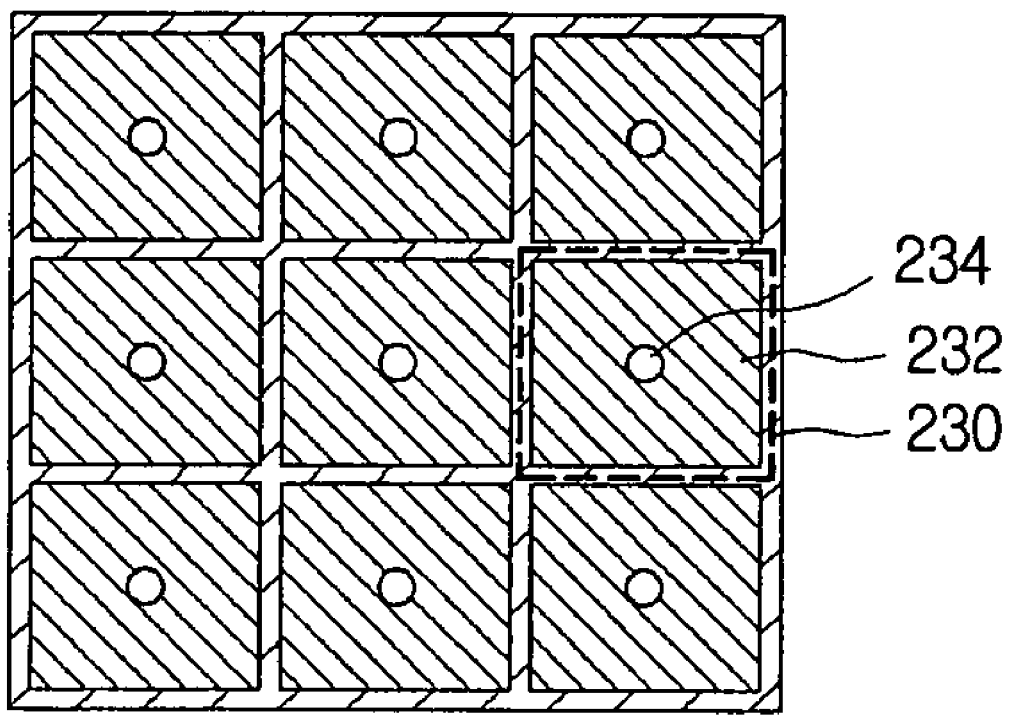
FIG. 3 is a plan view showing a metal plate configuration of the electromagnetic bandgap structure shown in FIG. 2.

Also, a plurality of stacked structures 370 (e.g. a two-layered mushroom type structure in the embodiment of the present invention) including the first metal plate 330, the first via 340, the second metal plate 335 and the second via 345 can be arranged as described in FIG. 3, for example. In other words, it is possible to block a signal having a frequency band corresponding to the operation frequency band of the analog circuit (e.g. the RF circuit) among the electromagnetic wave proceeding from the digital circuit to the analog circuit by allowing the stacked structure 370 to be away from each other at predetermined intervals to be repeatedly arranged.

For this, the second metal layer 210-2 can form a plurality of holes 350, and the stacked structures 370 can be arranged one by one at a position corresponding to a position in which each hole 350 is formed. At this time, the first metal plates 330 of the plurality of arranged stacked structures 370 can be arranged on the same or different planar surface (in the case of the second metal plates 335, the same can be described). Also, the plurality of holes 350 can be away from each other in regular intervals and be formed on the second metal layer 210-2.

Figure 4:
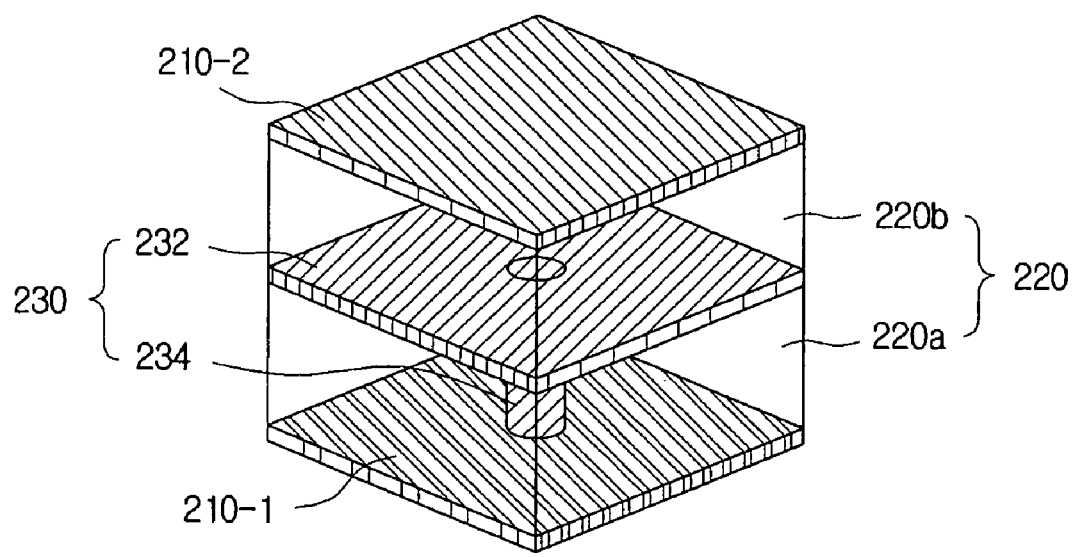
FIG. 4 is a perspective view showing the electromagnetic bandgap structure shown in FIG. 2.

As such, if the electromagnetic bandgap structure 300 by the stacked structure 370 including the first metal plate 330, the first via 340, the second metal plate 335 and the second via 345 is arranged inside the printed circuit board including the analog circuit and the digital circuit, since an inductance value corresponding to the via and a capacitance value corresponding to the dielectric layer can be acquired more enough as compared with the conventional electromagnetic bandgap structure of FIG. 4, the bandgap frequency can be lowered. This will be described more clearly with reference to FIG. 8.

As described above, the electromagnetic bandgap structure 300 of the present invention 300 can be arranged inside the printed circuit board having the analog circuit and the digital circuit. In other words, in accordance with an embodiment of the present invention, the printed circuit board can have the analog circuit and the digital circuit. At this time, the analog circuit can be the RF circuit such as an antenna receiving a wireless signal from an outside.

In the printed circuit board of the present invention, the electromagnetic bandgap structure 300 illustrated in FIG. 6 and FIG. 7 can be arranged between the analog circuit and the digital circuit. For example, the electromagnetic bandgap structure 300 can be arranged between the RF circuit 140 and the digital circuit 130 of the printed circuit board illustrated in FIG. 1. This is to block an electromagnetic wave having a frequency band which is similar to the operation frequency band (e.g. 0.8~2.0 GHz) of the RF circuit 140 among the transferred electromagnetic wave by arranging the electromagnetic bandgap structure 300 to allow the electromagnetic wave generated from the digital circuit 130 to necessarily pass through the electromagnetic bandgap structure 300 before being transferred to the RF circuit 140.

Accordingly, the electromagnetic bandgap structure 300 of the present invention can be arranged in a closed curve shape about the RF circuit 140 and the digital circuit 130. Alternatively, the electromagnetic bandgap structure 300 can be arranged in a signal transferring path between the digital circuit and the analog circuit. It is obvious that the electromagnetic bandgap structure 300 can be arranged in various ways.

As described above, arranging the electromagnetic bandgap structure 300 inside the printed circuit board can make it possible to prevent an electromagnetic wave having a frequency band of the electromagnetic wave transferred from the digital circuit to the analog circuit from being transferred. This can solve the mixed signal problem FIG. 8 is graphs showing results that are computer-simulated by using electromagnetic bandgap structures in accordance with a conventional art and an embodiment of the present invention.

Figure 8:
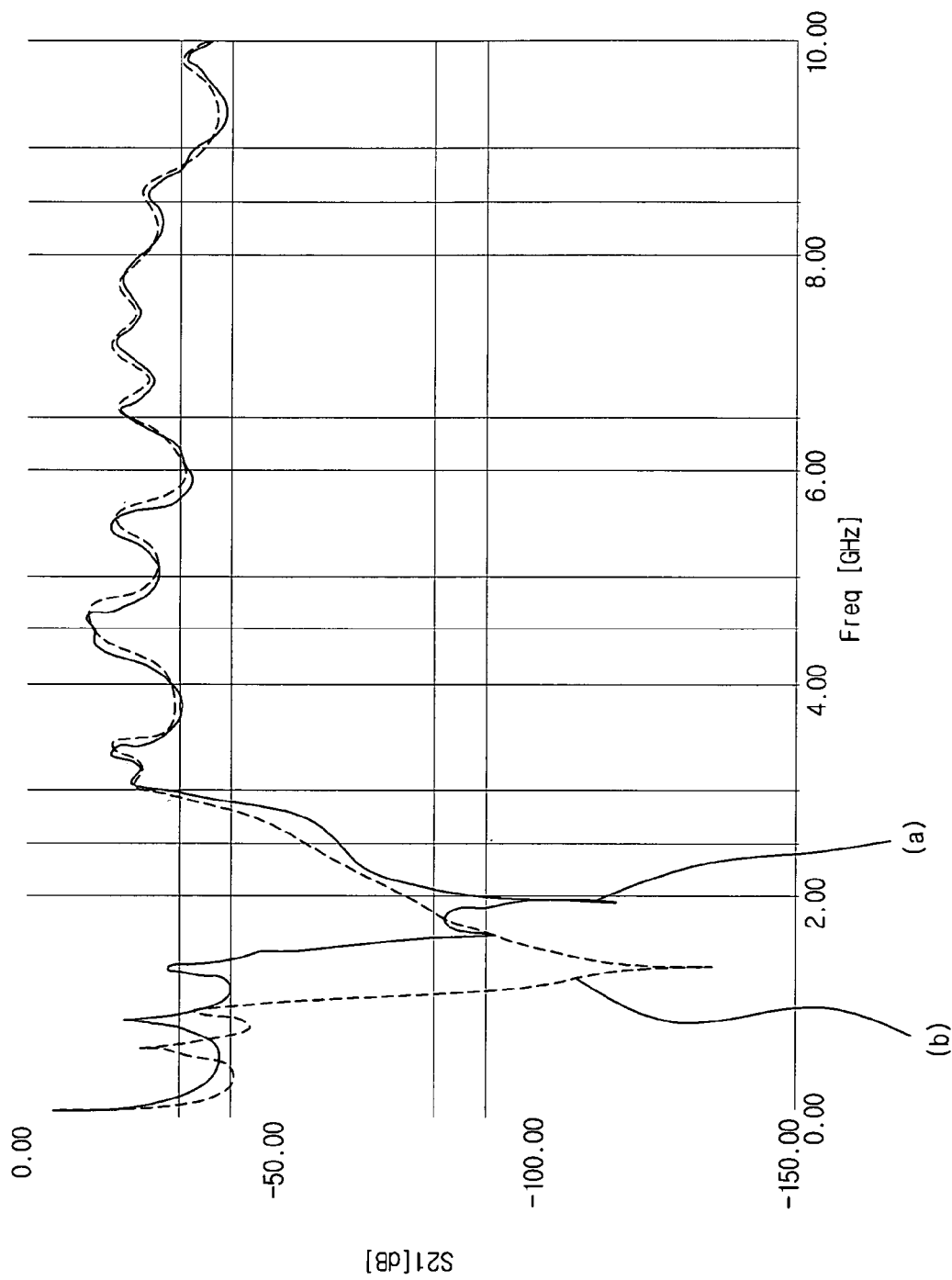
FIG. 8 is graphs showing results that are computer-simulated by using electromagnetic bandgap structures in accordance with a conventional art and an embodiment of the present invention.

FIG. 8 and the below table 1 show computer-simulated results that compare the case of the conventional electromagnetic bandgap structure 200 (refer to (a) of FIG. 8) with the case of the electromagnetic bandgap structure 300 of the present invention (refer to (b) of FIG. 8).

However, it must be understood clearly that despite the same design condition, FIG. 8 and the below table 1 are merely examples showing that having the stacked structure such as the electromagnetic bandgap structure 300 of the present invention can makes it possible to lower the bandgap frequency bandgap band largely as compared with the conventional electromagnetic bandgap structure 200.

In other words, the numbers shown for each parameter of the following table 1 can be merely values identically set for comparison and it is natural that adjusting various conditions such as the shape and size of the structure, and the thickness, dielectric constant and configuration of each element appropriately can design the electromagnetic bandgap structure to have a desired bandgap frequency band or a lower bandgap frequency band when controlling the bandgap frequency band blocked by the electromagnetic bandgap structure 300 of the present invention.

Each parameter of the following table 1 will be described before the description related to FIG. 8 and the following table 1. The 'structure size' refers to the size (area size) of the metal plate in one electromagnetic bandgap structure (refer to 232 of FIG. 3 or 330 (335) of FIG. 6), the 'structure distance' refers to the spaced distance between two adjacent electromagnetic bandgap structures. The 'upper dielectric layer thickness' refers to the thickness of the second dielectric layer 220b in the conventional electromagnetic bandgap structure 200, and the thickness of the second and third dielectric layers 220b and 220c in the electromagnetic bandgap structure 300 of the present invention. The 'lower dielectric layer thickness' refers to the thickness of the first dielectric layer 220a in the conventional electromagnetic bandgap structure 200 and the electromagnetic bandgap structure 300 of the present invention.

TABLE 1

|  | Conventional structure (shown in FIG. 4) | Structure of invention (shown in FIG. 6) |
| --- | --- | --- |
| Structure size | 81 mm² (9 × 9) | 81 mm² (9 × 9) |
| Upper dielectric layer thickness | 35 μm | 35 μm |
| Lower dielectric layer thickness | 100 μm | 100 μm |
| Structure distance | 1 mm | 1 mm |
| Bandgap frequency (on a (−)60 dB basis) | 1.54 GHz~2.55 GHz | 1.05 GHz~2.39 GHz |

Figure 5:
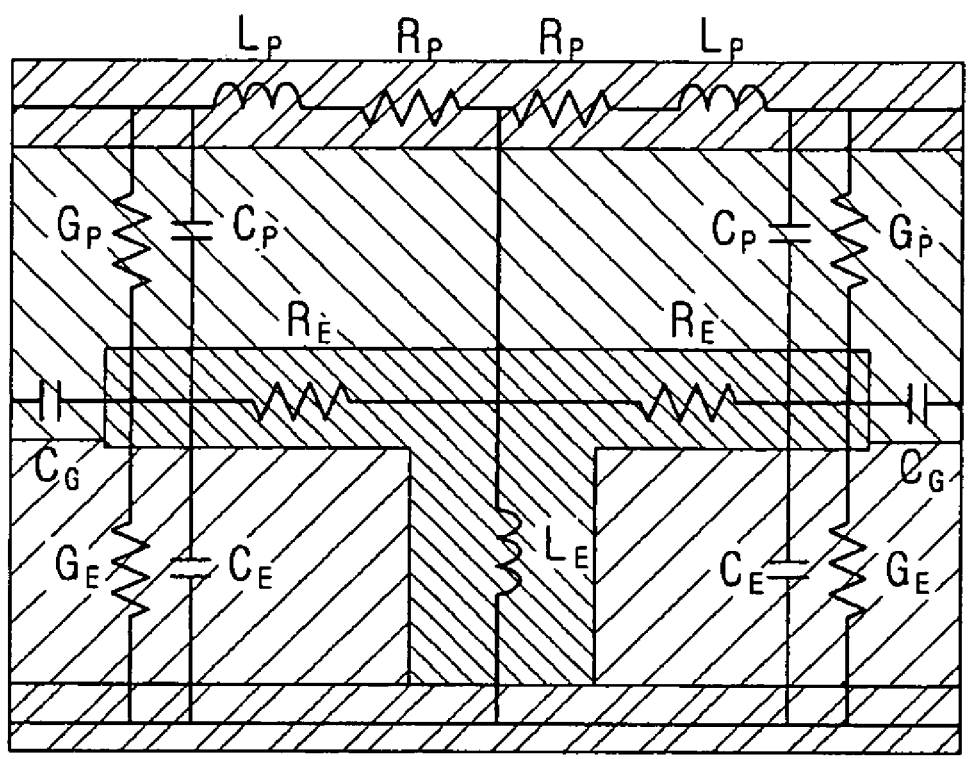
FIG. 5 is a schematic view showing an equivalent circuit of the electromagnetic bandgap structure shown in FIG. 2.

Referring to FIG. 8 and table 1, although the conventional electromagnetic bandgap structure 200 and the electromagnetic bandgap structure 300 of the present invention have the same design conditions such as the size of the structure, it can be recognized that the electromagnetic bandgap structure 300 of the present invention has the bandgap frequency band that is lower than approximately 0.5 GHz or more as compared with the conventional electromagnetic bandgap structure. This can be because the electromagnetic bandgap structure 300 of the present invention has the structure in which the mushroom type structures are stacked in a two-layered form (i.e. the stacked structure). This can be described below with reference to the equivalent circuit of FIG. 5.

The electromagnetic bandgap structure 300 of the present invention can acquire an inductance component corresponding to the lengthwise direction of the second via 345 (refer to $L_E$ component by the via 234 of FIG. 5) more as compared with the conventional electromagnetic bandgap structure 200 due to having the stacked structure. Also, the capacitance value according to the dielectric material included in the third dielectric layer 220c and the corresponding thickness (refer to $C_E$ and $C_P$ component by the dielectric layer 220 of FIG. 5) can be more acquired. As such, the bandgap frequency band blocked through the electromagnetic bandgap structure 300 of the present invention by the additionally acquired inductance value and capacitance value can be lowered as compared with the conventional structure.

Accordingly, if the electromagnetic bandgap structure 300 having the stacked structure like the present invention stacks a lot of mushroom type structures more (i.e. in a multi-layered form), since the acquired inductance value and capacitance value are increased, it can be easily recognized that it is possible to lower the bandgap frequency band more largely.

It can be also easily recognized that the two-layered stacked structure of the electromagnetic bandgap structure 300 of the present invention is very useful and appropriate through the fact that most of the typical printed circuit boards used for electronic apparatuses have the multi-layered (e.g. the printed circuit board applied to a mobile phone has 8 or 10-layered structure). In other words, since the printed circuit board itself is configured to include a plurality of layers, when the electromagnetic bandgap structure 300 of the present invention is applied to the printed circuit board, it can be unnecessary to add a separate stacking process and it is possible to maintain the height and volume of the printed circuit board as they are.

In addition, the electromagnetic bandgap structure 300 of the present invention can lower the bandgap frequency band more or select a desired bandgap frequency band by simply changing the configuration without the design process of minutely adjusting or changing the size, quantity and material of the structure to lower the bandgap frequency band.

Hitherto, although some embodiments of the present invention have been shown and described for the above-described objects, it will be appreciated by any person of ordinary skill in the art that a large number of modifications, permutations and additions are possible within the principles and spirit of the invention, the scope of which shall be defined by the appended claims and their equivalents.

What is claimed is:

1. An electromagnetic bandgap structure, comprising:
   a first metal layer;
   a first dielectric layer, stacked on the first metal layer;
   a first metal plate, stacked on the first dielectric layer;
   a first via, connecting the first metal layer to the first metal plate;
   a second dielectric layer, stacked on the first metal plate and the first dielectric layer;
   a second metal layer, stacked on the second dielectric layer and having a hole formed at a predetermined position;
   a third dielectric layer, stacked on the second metal layer;
   a second metal plate, stacked on the third dielectric layer; and
   a second via, penetrating the hole formed in the second metal layer and connecting the first metal plate and the second metal plate,
   wherein the first metal layer is any one of a ground layer and a power layer, and the second metal layer is the other.

2. The electromagnetic bandgap structure of claim 1, wherein the second via is formed to have an identical center axis to the first via.

3. The electromagnetic bandgap structure of claim 1, wherein the second via is formed to have an identical center axis to the hole,
   whereas a diameter of the hole is set to be larger than that of the second via.

4. The electromagnetic bandgap structure of claim 1 further comprising: a plurality of two-layered mushroom type structures including one or more additional first metal plates, one or more additional first vias, one or more additional second metal plates, and one or more additional second vias,
whereas a plurality of holes are formed in the second metal layer, according to a position of each second via of the two-layered mushroom type structures.

5. The electromagnetic bandgap structure of claim 4, wherein the plurality of holes are formed to be away from each other at regular intervals.

6. A printed circuit board having an analog circuit and a digital circuit, the printed circuit board including an electromagnetic bandgap structure that is disposed between the analog circuit and the digital circuit, the electromagnetic bandgap structure comprising:
a first metal layer;
a first dielectric layer, stacked on the first metal layer;
a first metal plate, stacked on the first dielectric layer;
a first via, connecting the first metal layer to the first metal plate;
a second dielectric layer, stacked on the first metal plate and the first dielectric layer;
a second metal layer, stacked on the second dielectric layer and having a hole formed at a predetermined position;
a third dielectric layer, stacked on the second metal layer;
a second metal plate, stacked on the third dielectric layer; and
a second via, penetrating the hole formed in the second metal layer and connecting the first metal plate and the second metal plate,
wherein the first metal layer is any one of a ground layer and a power layer, and the second metal layer is the other.

7. The electromagnetic bandgap structure of claim 6 further comprising: a plurality of two-layered mushroom type structures including one or more additional first metal plates, one or more additional first vias, one or more additional second metal plates, and one or more additional second vias,
whereas a plurality of holes are formed in the second metal layer, according to a position of each second via of the two-layered mushroom type structures.

8. The printed circuit board of claim 7, wherein the respective hole of each said two-layered mushroom type structure is formed to be away from each other at regular intervals.

9. The printed circuit board of claim 6, wherein the analog circuit is an RF circuit receiving a wireless signal.

10. The printed circuit board of claim 6, wherein the second via is formed to have an identical center axis to the first via.

11. The printed circuit board of claim 8, wherein the second via is formed to have an identical center axis to the hole,
whereas a diameter of the hole is set to be larger than that of the second via.

* * * * *

UNITED STATES PATENT AND TRADEMARK OFFICE
CERTIFICATE OF CORRECTION

PATENT NO. : 7,764,149 B2  Page 1 of 1
APPLICATION NO. : 12/007122
DATED : July 27, 2010
INVENTOR(S) : Mi-Ja Han et al.

It is certified that error appears in the above-identified patent and that said Letters Patent is hereby corrected as shown below:

Column 12, Line 17 delete "each other" and insert --one another--.

Column 12, Line 22 delete "claim 8," and insert --claim 6,--.

Signed and Sealed this

Seventh Day of December, 2010

David J. Kappos
*Director of the United States Patent and Trademark Office*